United States Patent
Vargha

(10) Patent No.: US 12,139,214 B2
(45) Date of Patent: Nov. 12, 2024

(54) TEMPERATURE MEASUREMENT OF A POWER SEMICONDUCTOR SWITCHING ELEMENT

(71) Applicants: thyssenkrupp Presta AG, Eschen (LI); thyssenkrupp AG, Essen (DE)

(72) Inventor: Balázs Vargha, Budapest (HU)

(73) Assignees: thyssenkrupp Presta AG, Eschen (LI); thyssenkrupp AG, Essen (DE)

( * ) Notice: Subject to any disclaimer, the term of this patent is extended or adjusted under 35 U.S.C. 154(b) by 884 days.

(21) Appl. No.: 17/276,202

(22) PCT Filed: Sep. 19, 2019

(86) PCT No.: PCT/EP2019/075116
§ 371 (c)(1),
(2) Date: Mar. 15, 2021

(87) PCT Pub. No.: WO2020/064485
PCT Pub. Date: Apr. 2, 2020

(65) Prior Publication Data
US 2022/0032996 A1 Feb. 3, 2022

(30) Foreign Application Priority Data
Sep. 27, 2018 (DE) .............. 10 2018 123 903.3

(51) Int. Cl.
*G01K 7/16* (2006.01)
*B62D 5/04* (2006.01)
*H03F 3/45* (2006.01)

(52) U.S. Cl.
CPC .............. *B62D 5/0496* (2013.01); *G01K 7/16* (2013.01); *H03F 3/45475* (2013.01); *G01K 2205/00* (2013.01); *G01K 2217/00* (2013.01)

(58) Field of Classification Search
CPC .... B62D 5/0496; G01K 7/16; G01K 2205/00; G01K 2217/00; G01K 7/015; G01K 7/01;
(Continued)

(56) References Cited

U.S. PATENT DOCUMENTS 5,473,260 A 12/1995 Hauswirth
5,909,108 A * 6/1999 He ..................... H02M 3/1584
323/225
(Continued)

FOREIGN PATENT DOCUMENTS

CN 102313863 A 1/2012
CN 104600669 A * 5/2015
(Continued)

OTHER PUBLICATIONS

17276202_Feb. 28, 2024_CN_104600669_A_H.pdf,May 6, 2015.*
(Continued)

*Primary Examiner* — Gail Kaplan Verbitsky
(74) *Attorney, Agent, or Firm* — thyssenkrupp North America, LLC

(57) ABSTRACT

A device for determining a temperature of a semiconductor power switch with a built-in temperature-dependent gate resistor may include a non-inverting amplifier circuit comprising an operational amplifier and a feedback resistor. Inverting input of the operational amplifier may be connected to the semiconductor power switch such that a gain of the non-inverting amplifier circuit in a predefined frequency range of an input signal depends on the built-in temperature-dependent gate resistor and the feedback resistor and is a measure of the temperature of the semiconductor power switch. The feedback resistor may be disposed between a negative input and an output of the operational amplifier.

7 Claims, 3 Drawing Sheets

(58) Field of Classification Search
CPC ............ G01K 7/346; G01K 7/30; G01K 1/14; G01K 7/186; G01K 2201/00; G01K 3/005; G01K 7/183; G01K 13/00; G01K 17/00; G01K 7/245; G01K 7/32; H03F 3/45475; B60T 17/221
USPC .................................................. 374/141, 178
See application file for complete search history.

(56) References Cited

U.S. PATENT DOCUMENTS

| | | | | |
|---|---|---|---|---|
| 7,965,522 | B1 * | 6/2011 | Hornberger | ............. H02M 1/08 363/21.1 |
| 2003/0038332 | A1 | 2/2003 | Kimura | |
| 2007/0221994 | A1 * | 9/2007 | Ishikawa | ............. H01L 27/0248 257/356 |
| 2007/0227805 | A1 * | 10/2007 | Walz | .................... B62D 5/0496 180/446 |
| 2009/0129432 | A1 * | 5/2009 | Luniewski | ............ H01L 25/162 374/E1.001 |
| 2009/0167414 | A1 | 7/2009 | Jansen | |
| 2012/0201272 | A1 * | 8/2012 | Schuler | .................... G01K 7/16 374/E7.018 |
| 2013/0257329 | A1 | 10/2013 | Orou | |
| 2014/0112372 | A1 | 4/2014 | Hoene | |
| 2015/0092819 | A1 | 4/2015 | Sugahara | |
| 2017/0104439 | A1 | 4/2017 | Kobayashi | |
| 2020/0099330 | A1 * | 3/2020 | Pacha | .................... H02P 29/68 |

FOREIGN PATENT DOCUMENTS

| | | | | | |
|---|---|---|---|---|---|
| CN | 204578808 | U | * | 8/2015 | |
| CN | 106289560 | A | * | 1/2017 | |
| CN | 107819408 | B | * | 4/2021 | ............... B60K 6/26 |
| DE | 102006001874 | A1 | * | 7/2007 | ............... G01K 7/30 |
| DE | 10 2008 063 806 | A | | 7/2009 | |
| DE | 102008021854 | A1 | * | 11/2009 | ........... B62D 5/0484 |
| DE | 10 2011 050 122 | A | | 6/2012 | |
| DE | 10 2011 083 679 | A | | 9/2012 | |
| DE | 10 2011 083 679 | B | | 9/2012 | |
| DE | 10 2012 102 788 | A | | 10/2013 | |
| DE | 10 2014 204 648 | A | | 9/2015 | |
| DE | 10 2016 217 674 | A | | 4/2017 | |
| EP | 0 636 866 | A | | 2/1995 | |
| EP | 2 541 220 | A | | 1/2013 | |
| EP | 2 575 255 | A | | 4/2013 | |
| GB | 1576282 | A | * | 10/1980 | ............... G01K 1/14 |
| GB | 2552232 | A | * | 1/2018 | ............... G01T 1/17 |
| JP | 2000358336 | A | * | 12/2000 | |
| JP | 2008298455 | A | | 12/2008 | |
| JP | 2023550361 | A | * | 12/2023 | |
| WO | WO-2012160092 | A2 | * | 11/2012 | ........... B62D 5/0484 |

OTHER PUBLICATIONS

17276202_Feb. 28, 2024_CN_107819408_B_H.pdf,Apr. 13, 2021.*
17276202_Mar. 4, 2024_JP_2023550361_A_H.pdf,Dec. 1, 2023.*
17276202_Mar. 4, 2024_JP_2000358336_A_H.pdf,Dec. 1, 2023.*
17276202_Jun. 24, 2024_CN_106289560_A_H.pdf,Jan. 4, 2017.*
17276202_Jun. 24, 2024_DE_102022202413_A1_H.pdf,Sep. 14, 2023.*
17276202_Jul. 2, 2024_CN_204578808_U_H.pdf,Aug. 19, 2015.*
17276202_Jul. 2, 2024_DE_102006001874_A1_H.pdf,Jul. 19, 2007.*
English Translation of International Search Report issued in PCT/EP2019/075116, dated Dec. 12, 2019.
Losmandy et al. "Operational Amplifier Applications for Audio Systems", Jan. 1969, vol. 17, No. 1, pp. 15-21.
Losmandy et al. "Operational Amplifier Applications for Audio Systems".

* cited by examiner

TEMPERATURE MEASUREMENT OF A POWER SEMICONDUCTOR SWITCHING ELEMENT

CROSS REFERENCE TO RELATED APPLICATIONS

This application is a U.S. National Stage Entry of International Patent Application Serial Number PCT/EP2019/075116, filed Sep. 19, 2019, which claims priority to German Patent Application No. DE 10 2018 123 903.3, filed Sep. 27, 2018, the entire contents of both of which are incorporated herein by reference.

FIELD

The present disclosure generally relates to methods and devices for determining temperatures of semiconductor power switching elements.

BACKGROUND

Power elements have a significant power loss which causes the chips to heat up to a temperature which may be considerably higher than the ambient temperature. The junction temperature is the most important variable of a power switch to be limited. The behavior of power elements, such as power switches, is negatively affected by excessively high temperatures. If a maximum permissible temperature is exceeded, there is a threat of a thermal event in the relevant component and the component no longer functions correctly or completely fails.

The published patent application DE 10 2014 204 648 A1 discloses a method for determining a temperature of an insulated gate bipolar transistor (IGBT). A driver for providing a first control voltage at the gate of the IGBT and a control voltage generator for providing a second control voltage at the gate of the IGBT are provided, wherein the driver and the control voltage generator are configured to be operated in an alternating manner, with the result that only one of the control voltages is ever present at the gate. The second control voltage comprises a DC voltage component and a superposed AC voltage component such that the IGBT is kept in blocking operation. A parasitic capacitance conducts the AC voltage, even though the IGBT remains in the blocking state. The gate current flows through the temperature-dependent input resistor, with the result that, in the case of a predetermined control voltage and a predetermined amplitude of the AC voltage, the gate current is a measure of the temperature of the IGBT, as a result of which the temperature of the IGBT can be determined.

DE 10 2012 102 788 A1 discloses a measurement of the junction temperature of a MOSFET, wherein a diode is provided on board, the cathode of which is internally connected to the source of the MOSFET, as a result of which the number of connections which are routed out and the chip area of the component can be reduced. The diode is directly coupled to the depletion layer of the MOSFET, thus making it possible to directly measure the junction temperature of the MOSFET. A current which is used to operate the diode in the forward direction is used to determine the junction temperature. The current flow through the diode generates a forward voltage across the diode that is temperature-dependent and current-dependent. This voltage can be measured between the anode of the diode and the source connection of the MOSFET.

The known temperature measurements are largely dependent on the current intensity, which results in inaccuracies in the determination of the temperature, in particular when using the semiconductor power switching elements in engine control units.

Thus, a need exists for a device for determining a temperature of a semiconductor power switching element, which device determines the temperature in a particularly accurate and reliable manner independently of the current intensity of the switched current.

DETAILED DESCRIPTION

Figure 1:
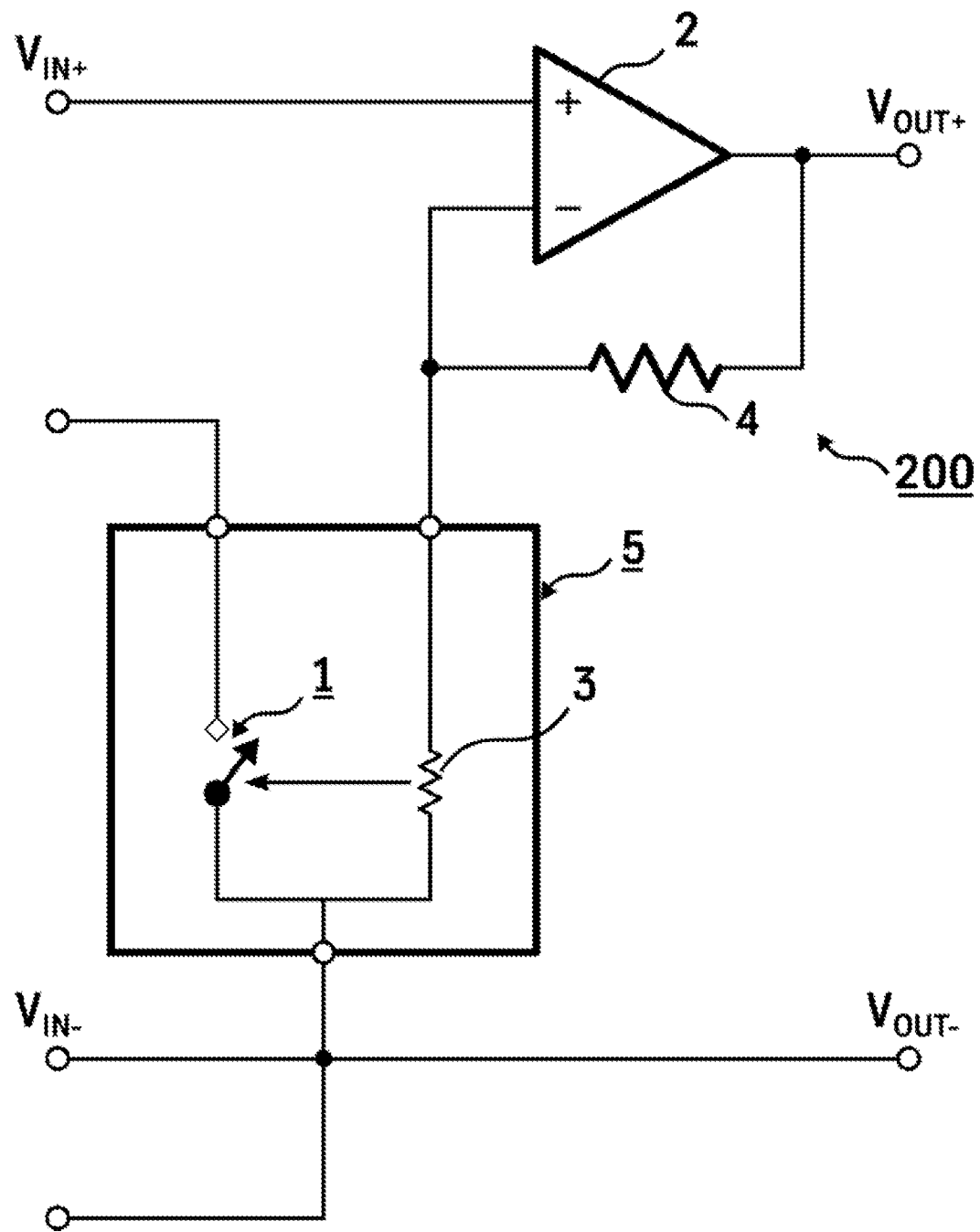
FIG. 1 is a circuit diagram of an example device for determining a temperature of a power switching element having a power switch and a non-inverting amplifier circuit.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting "a" element or "an" element in the appended claims does not restrict those claims to articles, apparatuses, systems, methods, or the like having only one of that element, even where other elements in the same claim or different claims are preceded by "at least one" or similar language. Similarly, it should be understood that the steps of any method claims need not necessarily be performed in the order in which they are recited, unless so required by the context of the claims. In addition, all references to one skilled in the art shall be understood to refer to one having ordinary skill in the art.

The present disclosure generally relates to devices for determining temperatures of semiconductor power switching elements. The present disclosure also relates to methods for measuring temperatures of semiconductor power switching elements.

Accordingly, a device for determining a temperature of a semiconductor power switching element having the semiconductor power switch with a built-in temperature-dependent gate resistor is provided, wherein the device has a non-inverting amplifier circuit comprising an operational amplifier and a feedback resistor, wherein the operational amplifier is connected to the semiconductor power switch in such a manner that the gain of the non-inverting amplifier circuit in a predefined frequency range of an input signal depends on the built-in temperature-dependent gate resistor and the feedback resistor and is a measure of the temperature of the semiconductor power switching element.

The measurement of the temperature using the most precisely known temperature dependence of the gate resistor is particularly reliable and independent of the current intensity. The calculated temperature is a good measure of the temperature of the depletion layer of the semiconductor power switch. In the predefined frequency range, the gain exhibits a dependence on the temperature of the gate resistor. It is preferred for the input impedance of the semiconductor power switch to be formed only or substantially by the gate resistor. This situation is particularly advantageous since the gain then exhibits the greatest dependence on the temperature of the gate resistor and a change in the temperature can be measured easily and accurately.

The feedback resistor is preferably arranged between the negative input and the output of the operational amplifier and/or the temperature-dependent gate resistor is arranged between the negative input of the operational amplifier and a reference voltage (normally ground) of the device.

The predefined frequency range is preferably above a frequency of a pole of a transfer function of an ideal non-inverting amplifier circuit.

The semiconductor power switching element is preferably a power MOSFET or an IGBT.

An electromechanical motor vehicle steering system having a multiphase permanently excited electric motor which can be controlled via an electronic control unit, wherein the electronic control unit has a multiplicity of semiconductor power switching elements which are part of an inverter, is also provided, wherein each of the semiconductor power switching elements has an above-described device for determining a temperature of the respective semiconductor power switching element. The system can also comprise the operation of switching semiconductor relays for each phase and may comprise means for determining an above-described temperature, which means have the respective semiconductor power switching element. In one preferred embodiment, the electric motor is three-phase and has two semiconductor power switching elements for each phase in a half-bridge circuit, which semiconductor power switching elements can be controlled by means of pulse width modulation. Other safety relays may or may not be included.

A method for measuring a temperature of a semiconductor power switching element having a built-in temperature-dependent gate resistor is also provided, wherein a non-inverting amplifier circuit having an operational amplifier and a feedback resistor, which is arranged between the negative input and the output of the operational amplifier, wherein the temperature-dependent gate resistor is arranged between the negative input of the operational amplifier and a negative input or a reference input of the overall circuit, and wherein the method has the following steps of:

operating the overall circuit with an input signal having a frequency which is in a predefined frequency range, with the result that the built-in temperature-dependent gate resistor forms a substantial part of the input impedance of the semiconductor power switch, measuring the gain of the non-inverting amplifier circuit, calculating the resistance of the built-in temperature-dependent gate resistor by means of the measured gain and determining the temperature of the semiconductor power switching element.

Another possibility is to calibrate the system since the output signal has a precisely defined dependence on the value of the gate resistor:

operating the overall circuit with an input signal having a frequency component which is in a predetermined frequency range, with the result that the built-in temperature-dependent gate resistor forms a substantial part of the input impedance of the semiconductor power switch, measuring the output signal from the non-inverting amplifier for at least two temperature values, calculating the temperature dependence of the output signal on the basis of a-priori knowledge, determining the temperature of the semiconductor power switch on the basis of the actual output signal and the predetermined temperature dependence.

The two methods allow the temperature of the semiconductor power switching element to be determined in a particularly accurate and reliable manner independently of the current intensity of the switched current.

The determined temperature is a measure of the junction temperature of the semiconductor power switching element.

The semiconductor power switching element is preferably a power MOSFET or an IGBT.

The predefined frequency range is above a frequency of a pole of a transfer function of an ideal non-inverting amplifier circuit.

FIG. 1 illustrates a circuit having a power MOSFET 5, which acts as a semiconductor power switching element 1, with a built-in gate resistor 3.

The semiconductor power switch 1 has a parallel circuit (not illustrated) of a multiplicity of individual semiconductor switches arranged on a common chip. A significant advantage of the semiconductor power switches 1 is the high possible switching frequency which is advantageous, for example, for pulse width modulation in an motor controller. The power MOSFET 5 has a built-in gate resistor 3 which is provided for the purpose of balancing the current distribution between the individual semiconductor switches on a chip in order to avoid parasitic oscillations and to reduce the Q factor of a possible RLC series circuit at the input. The built-in gate resistor 3 is part of an input impedance of the power MOSFET 5. The built-in gate resistor 3 has a known temperature dependence which is a measure of the temperature of the depletion layer of the semiconductor power switching element 1. The temperature-dependent change in the resistance of the gate resistor 3 is detected by means of a non-inverting amplifier circuit 200 comprising an operational amplifier 2, a feedback resistor 4 and the built-in gate resistor 3. The semiconductor power switch 1, with its input impedance, is arranged between the negative input of the operational amplifier 2 and a setpoint input of the complete circuit $V_{IN-}$.

The voltage $V_{IN+}$ to be amplified of the setpoint input of the operational amplifier 2 is applied to the non-inverting, positive input of the operational amplifier 2. A fraction of the output voltage $V_{OUT+}$ from the operational amplifier 2 is fed back to the inverting, negative input as negative feedback by means of voltage division using two resistors. The feedback resistor 4 is arranged between the negative input of the operational amplifier and the output.

The input impedance of the semiconductor power switch 1 can be modeled using an RC series circuit (see FIG. 2) having an input capacitor and an input resistor. In the case of a particular input signal, the series capacitance of the RC series circuit can be considered to be a short circuit, with the result that the input impedance is formed only by the built-in gate resistor 3. The gain of the non-inverting amplifier circuit 200 depends on a frequency f. In the case of frequencies above a cut-off frequency $f_P$, the input impedance is formed by the built-in gate resistor 3. The impedance of the capacitor 10 is reduced and can be considered to be a shortcut. This effect can be observed to an increasing extent with increasing frequency.

Figure 2:
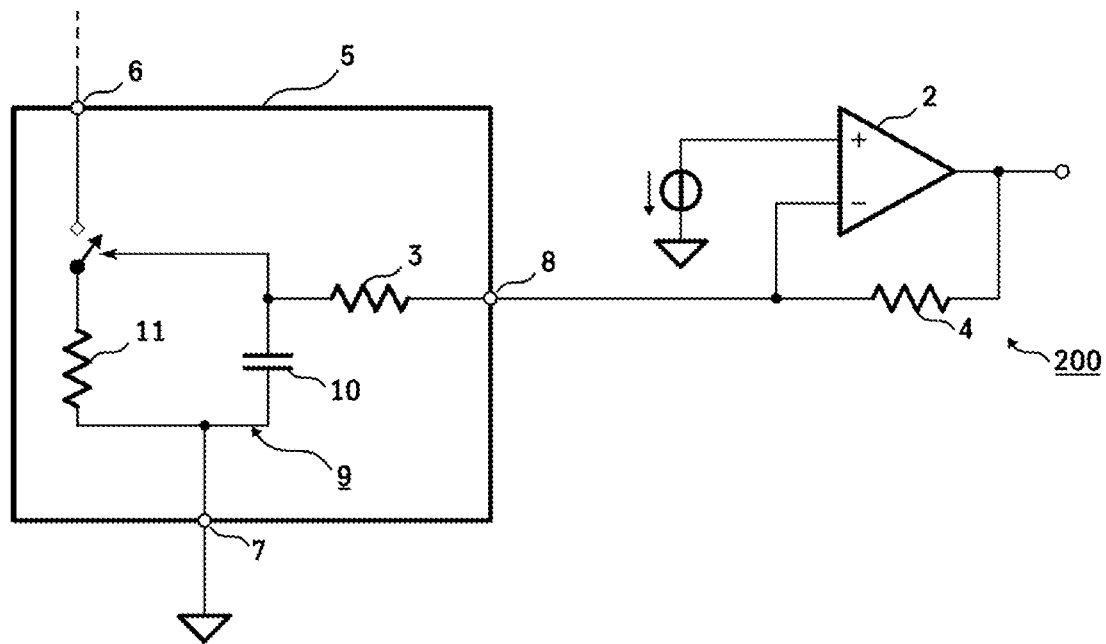
FIG. 2 is a circuit diagram of an example device for determining a temperature of a power MOSFET.

The cut-off frequency $f_P$ is calculated using the following formula:

$$f_P = \frac{1}{2\pi C_{GS} R_G}$$

where $C_{GS}$ is the input capacitor 10, $R_G$ is the gate resistor 3 (see FIG. 2).

In this case, the output of the operational amplifier 2 must adjust a ratio of the feedback resistor 4 and the gate resistor 3 in order to control the voltage at the negative input to that of the positive input $V_{IN+}$. The terminal gain of the operational amplifier between the input and output terminals is provided solely by the feedback resistor 4 and the gate resistor 3.

On account of the temperature dependence of the gate resistor 3, the gain of the non-inverting amplifier circuit 200 is a measure of the temperature of the depletion layer of the semiconductor power switch.

FIG. 2 shows a simplified model of a power MOSFET 5 which has a drain connection 6, a source connection 7 and a gate connection 8. The power MOSFET 5 is used in the above-described circuit for measuring the temperature of the depletion layer. In addition to the built-in gate resistor 3, the RC series circuit 9 for modeling the input impedances at the source connection 7 and drain connection 6 is also illustrated. An input capacitor 10 of the RC series circuit 9 symbolizes the capacitance of the gate, which is an intrinsic property of any MOSFET. The resistors 3 connected in series are installed in order to ensure a uniform distribution of voltage over the respective MOSFETs on the chip. Furthermore, a common input resistor 3 is provided and is intended to prevent the presence of high-frequency oscillations. The non-inverting amplifier circuit 200 operates as an amplifier with a gain factor of 1 for DC voltage signals. In this case, the capacitor 10 of the power MOSFET is treated as idling and the remaining circuit represents a gain of 1. The circuit begins to operate as an amplifier with an increase in the frequency of the voltage signal.

Figure 3:
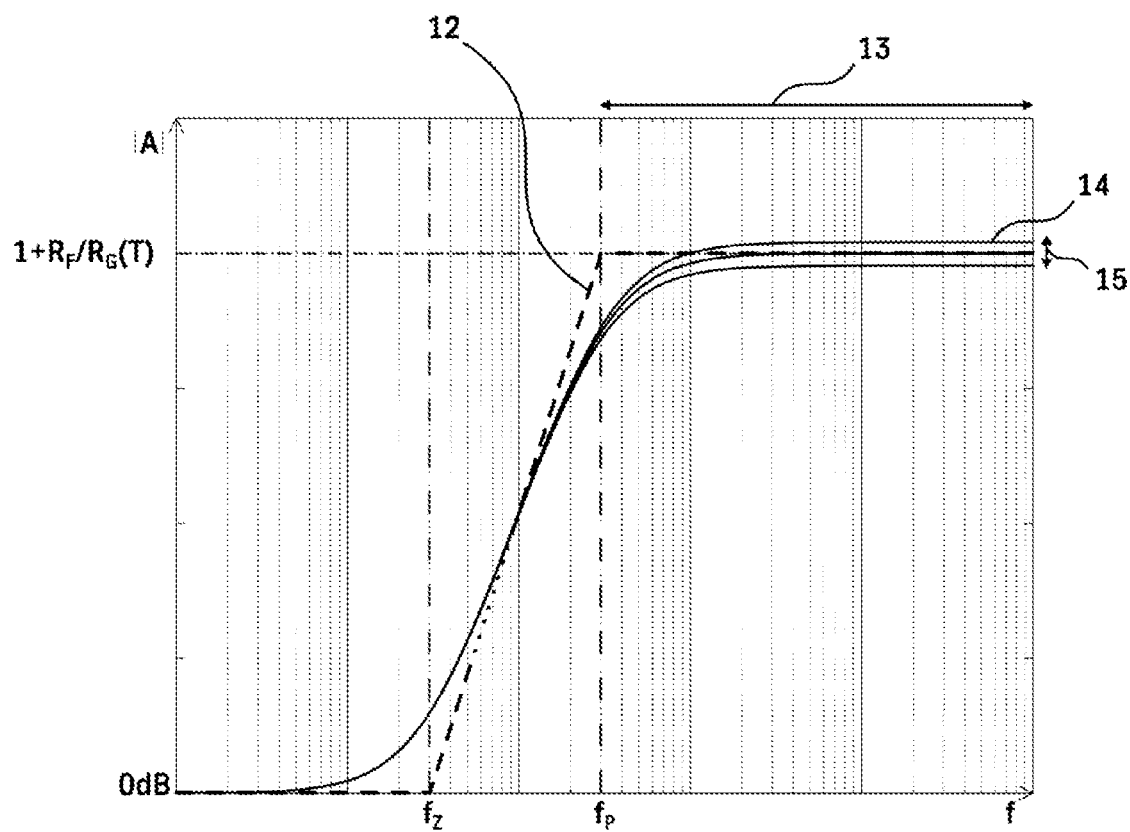
FIG. 3 is a graph with a transfer function of an ideal and a real non-inverting amplifier circuit.

FIG. 3 illustrates the transfer function of the non-inverting amplifier circuit 14. In this case, the gain of the non-inverting amplifier circuit is plotted against the frequency.

The asymptotically approximated transfer function of an ideal non-inverting amplifier circuit 12 is illustrated as a dashed line.

The transfer function of the non-inverting amplifier circuit 14 comprises a zero at $f_Z$ and a pole at $f_P$, wherein the frequency of the zero $f_Z$ is always less than the frequency of the pole $f_P$. The transfer function therefore exhibits the characteristics of a high-pass filter. If a true operational amplifier is used, the characteristics exhibit an additional pole and passband-like filtering. The horizontal arrow 13 indicates the frequency range in which the signal is amplified by the filter. The gain increases in the range between the zero and the pole, but the capacitor of the RC series circuit still exhibits enough impedance to superpose the slight temperature-related changes in the gate resistance, with the result that they are not visible in the gain. For frequencies above the pole, the impedance of the capacitor has slightly more influence on the input impedance and the capacitor behaves as if it were short-circuited. The gain is dependent on the temperature-dependent resistance. The vertical arrow 15 indicates the temperature-related fluctuation in the measured gain.

For frequencies above the pole $f > f_P$, the gain v is only dependent on the gate resistor $R_G(T)$ and the feedback resistor RF, like in a normal non-inverting amplifier:

$$v(T) = 1 + \frac{R_F}{R_G(T)}.$$

The invention is not limited to MOSFETs. It is also possible to use other semiconductor power switching elements which have a temperature-dependent resistor at a control input.

Semiconductor power switching elements are used, for example, in the phase winding of an electric motor of a steering system of a motor vehicle, preferably in the form of half-bridges, in particular a triple half-bridge for controlling a three-phase motor. The choice of a suitable semiconductor component results from the desired switching behavior. Power MOSFETs are preferably used as semiconductor components, but other components, for example IGBTs, can also be used. The temperature information determined using the apparatus according to the invention can be used, for example, to protect the MOSFETs from thermal overloading. If a critical junction temperature is reached, for example, steering assistance of an electromechanical steering system of a motor vehicle can be reduced and the power loss can therefore be reduced.

What is claimed is:

1. An electromechanical steering system of a motor vehicle having a multiphase permanently excited electric motor that is controllable via an electronic control unit, wherein the electronic control unit includes semiconductor power switches that are part of an inverter and/or disposed as a semiconductor relay in each phase, wherein each of the semiconductor power switches includes,
    a device for determining a temperature of the respective semiconductor power switch with a built-in temperature-dependent gate resistor;
    wherein the device includes a non-inverting amplifier circuit including an operational amplifier and a feedback resistor,
    wherein an inverting input of the operational amplifier is connected to the respective semiconductor power switch such that a gain of the non-inverting amplifier circuit in a predefined frequency range of an input signal depends on the built-in temperature-dependent gate resistor and the feedback resistor and is a measure of the temperature of the respective semiconductor power switch.

2. The electromechanical steering system of claim 1 wherein the multiphase permanently excited electric motor is three-phase and includes two of the semiconductor power switches for each phase in a half-bridge circuit, wherein the semiconductor power switches are controllable by way of pulse width modulation.

3. The electromechanical steering system of claim 1 wherein the feedback resistor is disposed between a negative input and an output of the operational amplifier.

4. The electromechanical steering system of claim 1 wherein the device includes an input, wherein the built-in temperature-dependent gate resistor is disposed between a negative input of the operational amplifier and the input of the device.

5. The electromechanical steering system of claim 1 wherein in the predefined frequency range of the input signal the built-in temperature-dependent gate resistor forms a majority of input impedance of the semiconductor power switch.

6. The electromechanical steering system of claim 1 wherein the predefined frequency range is above a frequency of a pole of a transfer function of an ideal non-inverting amplifier circuit.

7. The electromechanical steering system of claim 1 wherein the semiconductor power switch is a power MOSFET or an IGBT.

* * * * *